United States Patent
Lin et al.

(10) Patent No.: US 7,488,609 B1
(45) Date of Patent: Feb. 10, 2009

(54) METHOD FOR FORMING AN MGO BARRIER LAYER IN A TUNNELING MAGNETORESISTIVE (TMR) DEVICE

(75) Inventors: Tsann Lin, Saratoga, CA (US); Daniele Mauri, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 11/941,763

(22) Filed: Nov. 16, 2007

(51) Int. Cl.
*H01L 21/00* (2006.01)
(52) U.S. Cl. ............ 438/3; 257/E21.663; 365/145
(58) Field of Classification Search ............ 438/3; 257/E21.436, E21.663; 365/49.13, 145
See application file for complete search history.

(56) References Cited

U.S. PATENT DOCUMENTS

| 6,347,049 B1 | 2/2002 | Childress et al. |
| 6,841,395 B2 | 1/2005 | Lin et al. |
| 2006/0042930 A1 | 3/2006 | Mauri |
| 2007/0111332 A1 | 5/2007 | Zhao et al. |

FOREIGN PATENT DOCUMENTS

| JP | 10324969 | 12/1998 |
| WO | 9842890 A1 | 10/1998 |

OTHER PUBLICATIONS

Tsunekawa et al., "Giant tunneling magnetoresistive effect in low resistance CoFeB/MgO(001)/CoFeB magnetic tunnel junctions for read-head applications", Appl. Phys. Lett. 87, 072503 (2005).

Tsunekawa et al., "Huge Magnetoresistance and Low Junction Resistance in Magnetic Tunnel Junctions With Crystalline MgO Barrier", IEEE Transactions on Magnetics, vol. 42, No. 2, Feb. 2006, pp. 103-107.

(Continued)

*Primary Examiner*—W. David Coleman
(74) *Attorney, Agent, or Firm*—Thomas R. Berthold

(57) ABSTRACT

A method of forming a barrier layer of a tunneling magnetoresistive (TMR) device by forming first and second MgO barrier layers by different sputtering methods, but in the same sputtering system module. A first magnesium-oxide (MgO) barrier layer is formed over one of the TMR device's ferromagnetic layers by a DC magnetron sputter deposition from an Mg target in an oxygen environment. In the same module, a second MgO barrier layer is formed over the first MgO film by an RF sputter deposition from an MgO target and in an environment free of oxygen. Prior to the formation of the first MgO barrier layer, an optional Mg protection layer can be deposited on the ferromagnetic layer and oxidized by a first optional oxygen treatment. After deposition of the first MgO barrier layer, a second optional oxygen treatment may be conducted. After deposition of the second MgO barrier layer, a second Mg protection layer may be deposited by DC sputter deposition, followed by an optional third oxygen treatment.

16 Claims, 4 Drawing Sheets

OTHER PUBLICATIONS

Bowen et al., "Large magnetoresistance in Fe/MgO/FeCo (001) epitaxial tunnel junctions", Appl. Phys. Lett. 79, 1655 (2001).

Mitani et al., "Fe/MgO/Fe(100) epitaxial magnetic tunnel junctions prepared by using in situ plasma oxidation", J. Appl. Phys. 90, 8041 (2003).

Popova et al., "Epitaxial MgO for low-resistance and coupling-free magnetic tunnel junctions", Appl. Phys. Lett., vol. 81, No. 6, Aug. 5, 2002, pp. 1035-1037.

Abstract: Y. Matsuda et al. "Quantitative modeling of reactive sputtering process for MgO thin film deposition", Thin Solid Films Conference, vol. 390, No. 1-2, Jun. 30, 2001, pp. 59-63.

Abstract: Y. Matsuda et al., "MgO deposition using reactive ionized sputtering", Thin Solid Films, vol. 435, No. 1-2, Jul. 1, 2003, pp. 154-160.

Van Dijken, et al., "Room Temperature Operation of a High Output Magnetic Tunnel Transistor", Appl. Phys. Lett. 80, 3364-3366 (2002).

METHOD FOR FORMING AN MGO BARRIER LAYER IN A TUNNELING MAGNETORESISTIVE (TMR) DEVICE

BACKGROUND OF THE INVENTION

1. Field of the Invention

The invention relates generally to tunneling magnetoresistive (TMR) devices, and more particularly to a method for forming a barrier layer consisting essentially of a magnesium oxide (MgO).

2. Description of the Related Art

A tunneling magnetoresistive (TMR) device, also called a magnetic tunneling junction (MTJ) device, is comprised of two ferromagnetic layers separated by a thin insulating tunneling barrier layer. The barrier layer is typically made of a metallic oxide, such as alumina ($Al_2O_3$) or MgO, that is so sufficiently thin that quantum-mechanical tunneling of charge carriers occurs between the two ferromagnetic layers. This quantum-mechanical tunneling process is electron spin dependent, which means that an electrical resistance measured when applying a sense current across the junction depends on the spin-dependent electronic properties of the ferromagnetic and barrier layers, and is a function of the relative orientation of the magnetizations of the two ferromagnetic layers. The magnetization of the first ferromagnetic layer is designed to be pinned, while the magnetization of the second ferromagnetic layer is designed to be free to rotate in response to external magnetic fields. The relative orientation of their magnetizations varies with the external magnetic field, thus resulting in change in the electrical resistance. The TMR device is usable as a memory cell in a nonvolatile magnetic random access memory (MRAM) array, as described in U.S. Pat. No. 5,640,343, and as TMR read head in a magnetic recording disk drive, as described in U.S. Pat. No. 5,729,410.

FIG. 1 illustrates a cross-sectional view of a conventional TMR device 10. The TMR device 10 includes a bottom "fixed" or "pinned" ferromagnetic (FM) layer 18, an insulating tunneling barrier layer 20, and a top "free" FM layer 32. The TMR device 10 has bottom and top nonmagnetic electrodes or leads 12, 14, respectively, with the bottom nonmagnetic electrode 12 being formed on a suitable substrate. The FM layer 18 is called the "pinned" layer because its magnetization is prevented from rotation in the presence of an applied magnetic field in the desired range of interest for the TMR device, i.e., the magnetic field caused by the write current applied to the memory cell from the read/write circuitry of the MRAM, or the magnetic field from a recorded magnetic layer in a magnetic recording disk. The magnetization of the pinned FM layer 18 can be fixed or pinned by being formed of a high-coercivity film or by being exchange-coupled to an antiferromagnetic "pinning" layer. The pinned FM layer 18 may be replaced by a flux-closure structure, where two ferromagnetic layers are separated by an antiparallel spacer layer and thus antiparallel-coupled to form a flux closure, as described in U.S. Pat. No. 5,465,185. The magnetization of the free FM layer 32 is free to rotate in the presence of the applied magnetic field in the range of interest. In the absence of the applied magnetic field, the magnetizations of the FM layers 18 and 32 are aligned generally parallel in a TMR memory cell and generally perpendicular in a TMR read head. The relative orientation of the magnetizations of the FM layers 18, 32 determines the electrical resistance of the TMR device.

An important read-performance parameter of the TMR device is a high signal-to-noise ratio (SNR). The magnitude of the signal depends on a TMR coefficient ($\Delta R/R$) exhibited by the TMR device, where $\Delta R$ or ($R_{MAX}-R_{MIN}$) is the difference between the resistance measured when the magnetizations of the two ferromagnetic layers are antiparallel ($R_{MAX}$) and the resistance measured when the magnetizations of the two ferromagnetic layers are parallel ($R_{MIN}$), and R is $R_{MIN}$. The magnitude of the noise depends on, in large part, the resistance of the TMR device. Thus to obtain the maximum SNR for a constant power used to sense the TMR device, the resistance of the TMR device must be small and the change in resistance ($\Delta R$) of the TMR device large. The resistance of the TMR device is largely determined by the contact resistances at lower metallic/oxide and upper oxide/metallic interfaces ($R_C$ and $R_C'$, respectively) and the resistivity ($\rho$) of the insulating tunneling barrier layer, which are much larger than the contact resistances at all other metallic/metallic interfaces and the resistivities of all other metallic films, respectively. Moreover, because the sense current flows perpendicularly through all the interfaces, the resistance of the TMR device of a given dimension increases proportionally with the thickness of the barrier layer ($\delta$) and inversely with the area of the barrier layer (A). It is convenient to characterize the resistance of the TMR device by the product of the resistance R times the area A (RA), as a figure of merit to correlate with the amplitude of the noise. As described previously, this RA can be estimated as the sum of $R_C A$, $R_C' A$ and $\rho\delta$. As the TMR device is further miniaturized to achieve higher densities in memory cells or in recording media, it becomes more stringent to maintain a high SNR. Thus, it is desirable to develop a TMR device with an improved tunneling barrier layer which exhibits a higher $\Delta R/R$ and a lower RA.

TMR devices with MgO barrier layers and various processes for forming MgO barrier layers are well known. U.S. Pat. No. 6,841,395 B2 describes a three-step process for making an MgO barrier layer by depositing an Mg film in an argon gas in a DC magnetron sputtering module, depositing an oxygen-doped Mg film in mixed xenon and oxygen gases in an ion-beam sputtering module, and oxidizing these films in an oxygen gas in an oxygen treatment module. US 2007/0111332 A1 describes a process for making a barrier layer comprising Mg/MgO/Mg films wherein the lower and upper Mg films are deposited by a DC sputtering method and the intermediate MgO film is formed by natural oxidation of an Mg film. Tsunekawa et al. "Giant tunneling magnetoresistive effect in low resistance CoFeB/MgO(001)/CoFeB magnetic tunnel junctions for read-head applications", *Appl. Phys. Lett.* 87, 072503 (2005) describe a TMR device with an MgO barrier layer comprising Mg/MgO films wherein the Mg film as thin as 0.1 nm is deposited by a DC sputtering method and the MgO film is RF sputter deposited from an MgO target. Although this prior-art process for forming the barrier layer comprising the Mg/MgO films results in a TMR device that exhibits reasonably high $\Delta R/R$ and reasonably low RA, the antiferromagnetic pinning and ferromagnetic free layers used in this prior-art process are not suitable for the TMR device to function properly.

What is needed is a method for forming an MgO barrier layer that results in a TMR device exhibiting even higher $\Delta R/R$ and even lower RA while maintaining good antiferromagnetic and ferromagnetic properties for the TMR device to function properly.

SUMMARY OF THE INVENTION

The invention relates to a method of forming a barrier layer of a tunneling magnetoresistive (TMR) device. In a sputtering system module, a first magnesium-oxide (MgO) barrier layer or film is formed over one of the TMR device's ferromagnetic layers by a DC magnetron sputter deposition from an Mg target in an oxygen environment. In the same module, a second MgO barrier layer or film is formed over the first MgO film by an RF sputter deposition from an MgO target and in an environment substantially free of oxygen.

Prior to the formation of the first MgO barrier layer by DC sputter deposition, an optional Mg protection layer can be deposited on the ferromagnetic layer and oxidized by a first optional oxygen treatment. After deposition of the first MgO barrier layer, a second optional oxygen treatment may be conducted. After deposition of the second MgO barrier layer by RF sputter deposition, a second Mg protection layer may be deposited by DC sputter deposition, followed by an optional third oxygen treatment.

For a fuller understanding of the nature and advantages of the present invention, reference should be made to the following detailed description taken together with the accompanying figures.

DETAILED DESCRIPTION OF THE INVENTION

Figure 1:
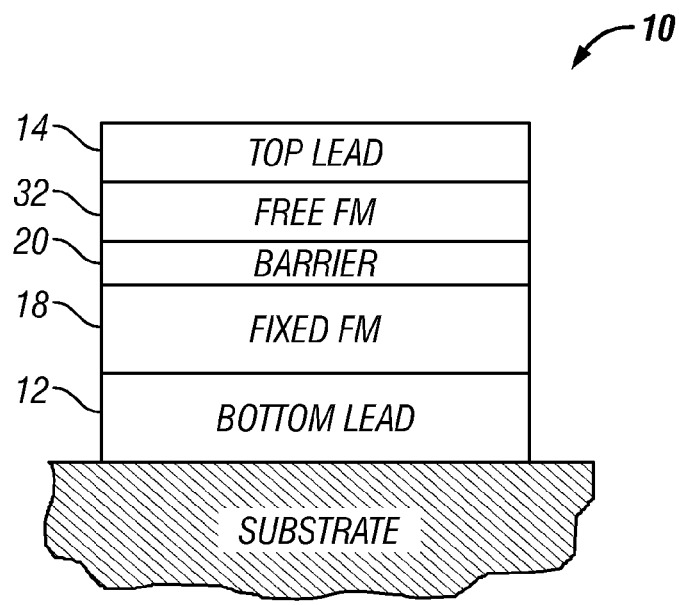
FIG. 1 is a cross-sectional view illustrating the structure of a conventional tunneling magnetoresistive (TMR) device
Figure 2:
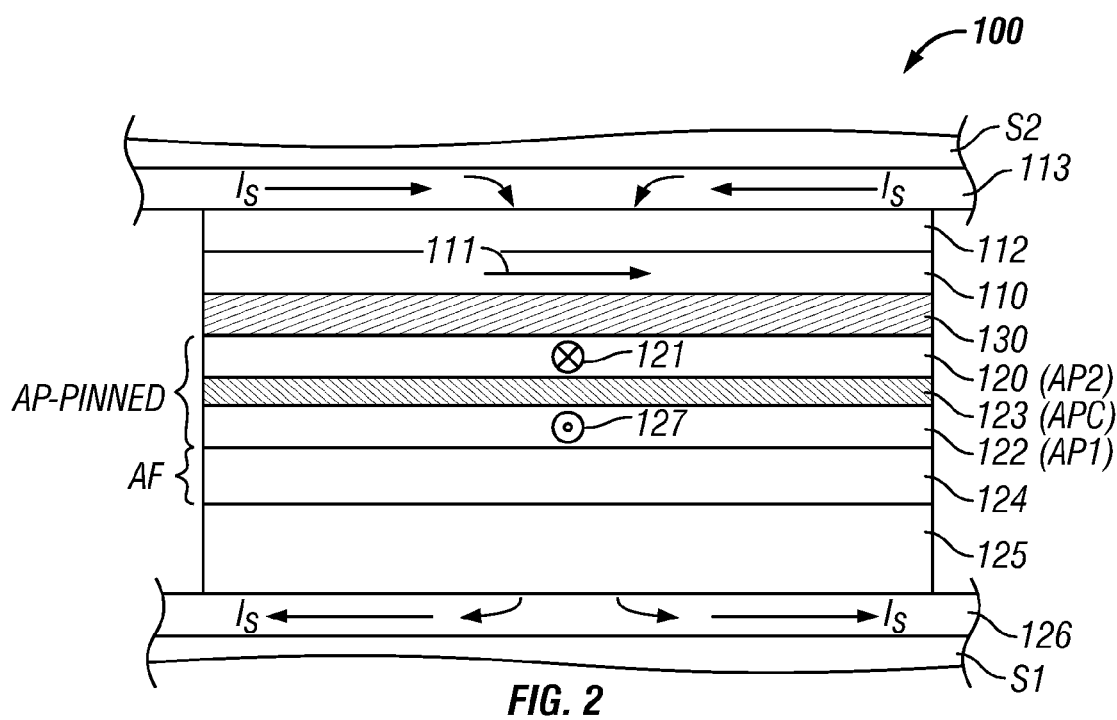
FIG. 2 is a cross-sectional view illustrating the structure of a prior-art TMR read head used in a magnetic recording disk drive.

FIG. 2 is a cross-sectional view illustrating the structure of a prior-art TMR read head 100 like that used in a magnetic recording disk drive. This cross-sectional view is a view of what is commonly referred to as the air-bearing surface (ABS) of the TMR read head 100. The TMR read head 100 includes a sensor stack of layers formed between two ferromagnetic shield layers S1, S2 that are typically made of electroplated NiFe alloy films. The lower shield S1 is typically smoothened by chemical-mechanical polishing (CMP) to provide a smooth surface for the growth of the sensor stack. The sensor stack includes a ferromagnetic reference layer 120 having a pinned magnetization 121 oriented transversely (away from the page), a ferromagnetic free layer 110 having a magnetization 111 that can rotate in the plane of layer 110 in response to transverse external magnetic fields from a recording disk, and an electrically insulating barrier layer 130, typically made of an oxide, such as alumina ($Al_2O_3$) or magnesium-oxide (MgO), between the ferromagnetic reference layer 120 and ferromagnetic free layer 110. The ferromagnetic reference layer 120 is part of a flux-closure structure, or an antiparallel(AP)-pinned structure, as described in U.S. Pat. No. 5,465,185.

The AP-pinned or flux-closure structure comprises the ferromagnetic reference layer 120 (AP2) and a ferromagnetic lower layer 122 (AP1), sometimes called the "keeper" layer, that are separated by an antiparallel-coupling (APC) layer 123. Due to the antiparallel coupling across the APC layer 123, the reference (AP2) and keeper (AP1) ferromagnetic layers 120, 122 have their respective magnetizations 121, 127 oriented antiparallel to each other. As a result, the net magnetization of the AP2 and AP1 ferromagnetic layers 120, 122 is so small that a demagnetizing field induced by the flux closure structure in the ferromagnetic free layer 110 is substantially minimized, and thus it becomes feasible for the TMR read head to operate optimally.

Located between the lower shield layer S1 and the AP-pinned structure are seed layer 125 and an antiferromagnetic (AFM) pinning layer 124. The seed layer 125 facilitates the AFM pinning layer 124 to grow a microstructure with a strong crystalline texture and thus develop strong antiferromagnetism. The seed layer 125 may be a single layer or multiple layers of different materials. The AFM pinning layer 124 thus strongly exchange-couples to the ferromagnetic keeper layer 122, and thereby rigidly pins the magnetization 127 of the ferromagnetic keeper layer 122 in a direction perpendicular to and away from the ABS. The antiparallel coupling across the APC layer 123 then subsequently rigidly pins the magnetization 121 of the ferromagnetic reference layer 120 in a direction perpendicular to and towards the ABS, and antiparallel to magnetization 127. As a result, the net magnetization of the ferromagnetic AP2 and AP1 layers 120, 122 is rigidly pinned, and thus the optimal operation of the TMR read head is ensured.

Located between the ferromagnetic free layer 110 and the upper shield layer S2 is a layer 112, sometimes called a capping or cap layer. The layer 112 protects the ferromagnetic free layer 110 from chemical and mechanical damages during processing, so that ferromagnetic free layer 110 maintains good ferromagnetic properties.

In the presence of external magnetic fields in the range of interest, i.e., magnetic fields from written data on the recording disk, while the net magnetization of the ferromagnetic layers 120, 122 remains rigidly pinned, the magnetization 111 of the ferromagnetic free layer 110 will rotate in responses to the magnetic fields. Thus when a sense current $I_S$ flows from the upper shield layer S2 perpendicularly through the sensor stack to the lower shield layer S1, the magnetization rotation of the ferromagnetic free layer 111 will lead to the variation of the angle between the magnetizations of the ferromagnetic reference layer 120 and the ferromagnetic free layer 110, which is detectable as the change in electrical resistance.

FIG. 2 shows optional separate electrical leads 126, 113 between shields S1, S2, respectively, and the sensor stack. Leads 126, 113 may be formed of Ta, Rh. The leads are optional and may be used to adjust the shield-to-shield spacing. If the leads 126 and 113 are not present, the bottom and top shields S1 and S2 are used as electrical leads. The ferromagnetic keeper, reference and free layers 122, 120, and 110 are typically formed of a CoFe, CoFeB or NiFe film, or formed of multiple layers comprising these films. The seed layer 125 is typically formed of multiple layers comprising Ta/NiFeCr/NiFe, Ta/NiFe, Ta/Ru or Ta/Cu films. The AFM pinning layer 124 is typically made of an FeMn, NiMn, PtMn, IrMn, PdMn, PtPdMn or RhMn film. The cap layer 112 is typically made of a Ru or Ta film.

This invention relates to a TMR device, such as a memory cell for use in MRAM or a TMR read head or sensor for use in disk drives, but more particularly to a method for forming a barrier layer formed of MgO. TMR devices with MgO barrier layers are well known. As part of the development of this invention, TMR devices with a DC sputtered MgO barrier layer and with an RF sputtered MgO barrier layer were fabricated and tested.

A TMR sensor with a MgO barrier layer DC sputtered in a mixture of argon and oxygen gases from an Mg target was fabricated and tested. This TMR sensor exhibited a TMR coefficient ($\Delta R/R$) of 68% at a junction resistance-area product (RA) of 3.22 $\Omega$-$\mu m^2$, and high thermal stability when operating at a sensor voltage ($V_S$) of no more than about 200 mV. However, when decreasing RA to around 2.4 $\Omega$-$\mu m^2$ or increasing $V_S$ to around 255 mV, its thermal stability begins to deteriorate. It is speculated that this low thermal stability originates from pinholes in the DC sputtered MgO barrier layer.

A TMR sensor with an MgO barrier layer RF sputtered in an argon gas from an MgO target was also fabricated and tested. This TMR sensor exhibited $\Delta R/R$ of 92% and 86% at RA of 3.2 and 2.4 $\Omega$-$\mu m^2$, respectively, and high thermal stability when operating at a sensor voltage ($V_S$) of up to about 255 mV. It is believed that this high thermal stability originates from a strong polycrystalline <111> texture in the RF sputtered MgO barrier layer. However, in this TMR sensor with the RF sputtered MgO barrier layer, $\Delta R/R$ sharply decreases as RA decreases to below 2 $\Omega$-$\mu m^2$. It is thus difficult for this TMR sensor to perform magnetic recording at ever higher densities, since this TMR sensor is not viable in the low-RA regime.

Figure 3:
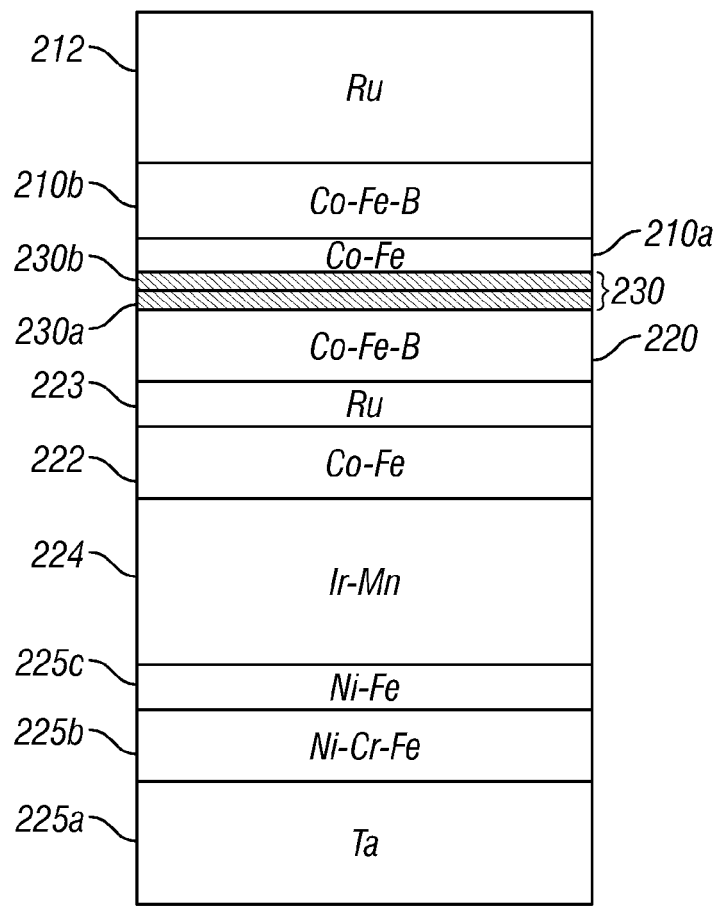
FIG. 3 is a cross-sectional view of a TMR read sensor fabricated according to the method of this invention.

The TMR read sensor fabricated by the method of this invention will be described with respect to FIG. 3, which except the MgO barrier layer and the method for making it, is substantially similar to the prior art TMR read head of FIG. 2. The barrier layer 230 preferably comprises a 0.4 nm thick DC sputtered MgO lower barrier layer 230a and a 0.4 nm thick RF sputtered MgO upper barrier layer 230b, which are sandwiched between lower and upper sensor stacks. The lower sensor stack comprises a 3 nm thick nonmagnetic Ta seed layer 225a, a 2 nm thick nonmagnetic 12Ni-40Cr-48Fe (where the numbers represent atomic percent) seed layer 225b, a 0.8 nm thick ferromagnetic 92Ni-8Fe seed layer 225c, a 6 nm thick antiferromagnetic 20Ir-80Mn pinning layer 224, a 2.1 nm thick ferromagnetic 78Co-22Fe keeper layer 222, a 0.8 nm thick nonmagnetic Ru APC layer 223, and a 2 nm thick ferromagnetic 53Co-33Fe-14B reference layer 220. The upper sensor stack comprises a bilayer free layer (0.4 nm thick ferromagnetic 86Co-14Fe lower free layer 210a and a 2.6 nm thick ferromagnetic 72Co-8Fe-20B upper free layer 210b), and a 6 nm thick nonmagnetic Ru cap layer 212.

Figure 4:
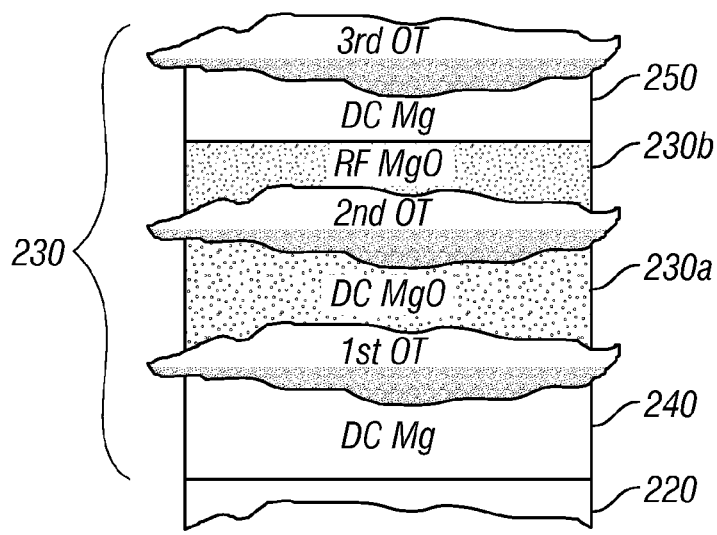
FIG. 4 is a cross-sectional view of a barrier layer fabricated according to the method of this invention.
Figure 5:
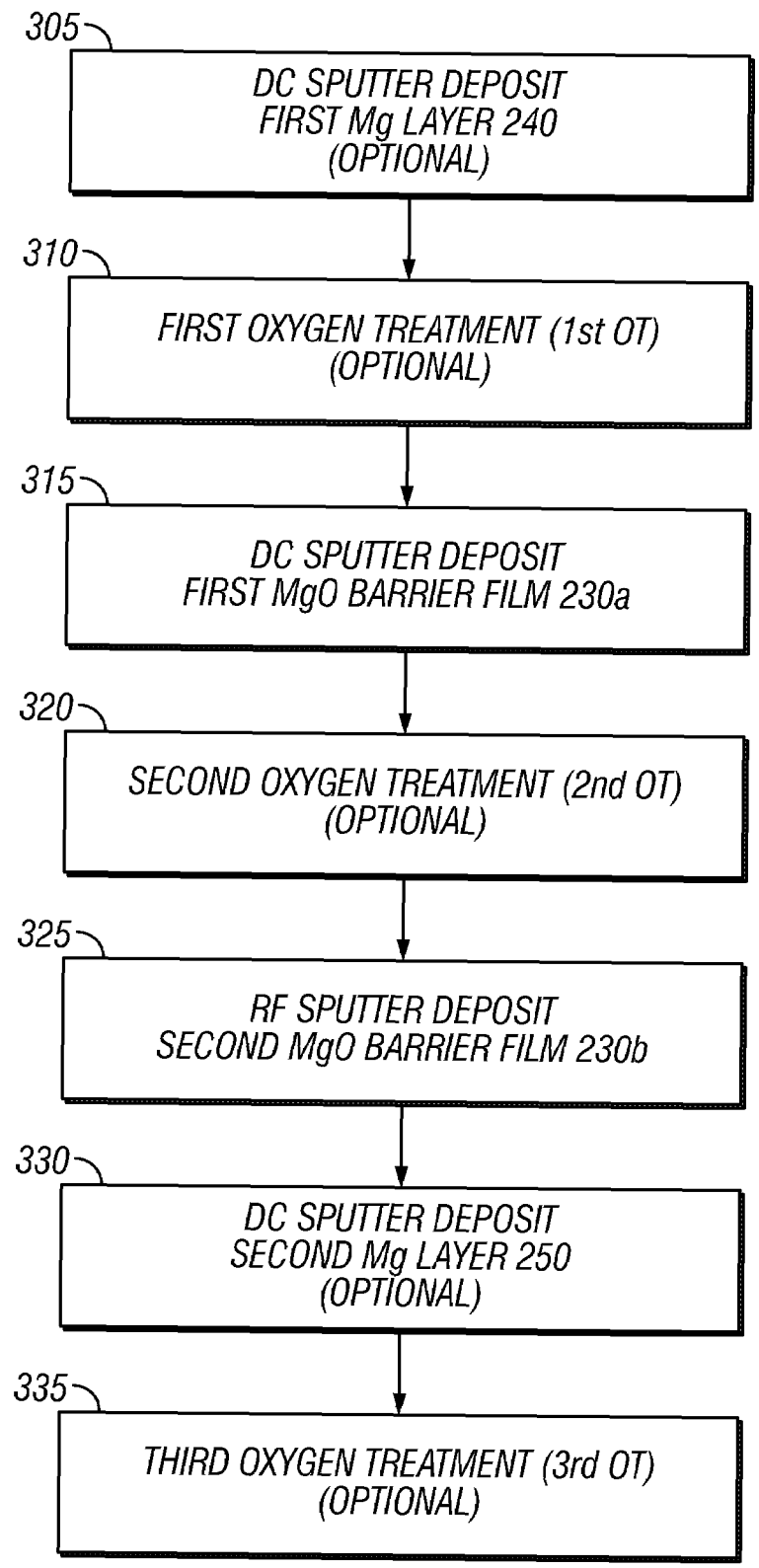
FIG. 5 is a process flow chart according to the method of this invention.

The barrier layer 230 comprises the DC magnetron sputtered MgO lower barrier layer 230a and the RF sputtered MgO upper barrier layer 230b, which are formed in-situ in the same sputtering module, as described below. FIG. 4 depicts a cross-sectional view of a barrier layer fabricated according to the method of this invention, and FIG. 5 illustrates a process flow chart according to the method of this invention. First, after heavily cleaning a Mg target for 60 seconds with a target power of 600 W to remove or erase any previous sputtering history, a 0.2 nm thick Mg protection layer 240 (FIG. 4) is DC sputtered in an argon gas of $3 \times 10^{-4}$ torr from an Mg target with a target power of 40 W onto the ferromagnetic reference layer 220 in one module of a sputtering system (FIG. 5, block 305).

A first oxygen treatment ($1^{st}$ OT) in an oxygen gas of $5 \times 10^{-7}$ torr is then applied to the Mg protection layer 240 in the same module, resulting in oxygen doping into the Mg protection layer 240 (block 310). The deposition of the Mg protection layer 240 and its subsequent oxygen treatment ($1^{st}$ OT) are optional steps. Next, the lower MgO barrier layer 230a is DC sputtered in a mixture of argon and oxygen gases from the same Mg target with a target power of 100 W in the same module (block 315). This forms the lower MgO layer 230a directly on the oxygen-doped Mg protection layer 240, or directly on the ferromagnetic reference layer 220 if the optional Mg protection layer 240 is not first deposited. An optional second oxygen treatment ($2^{nd}$ OT) in an oxygen gas of $5 \times 10^{-7}$ torr may then be applied to the DC sputtered MgO lower barrier layer 230a in the same module (block 320). Next, after coating the inner wall of the same module with a 60 nm thick Ta film for achieving a high vacuum through gettering, and heavily cleaning an MgO target for 300 seconds with a target power of 200 W to erase any previous sputtering history, the upper MgO barrier layer 230b is RF sputtered in an argon gas of $1.2 \times 10^{-4}$ torr from the MgO target with a target power of 200 W onto the DC sputtered MgO lower barrier layer 230a in the same module (block 325).

The process techniques used for achieving a low RA while maintaining a high $\Delta R/R$ are described below. The Mg protection layer 240, if used, provides a metallic/metallic contact resistance between the Mg protection layer 240 and the ferromagnetic reference layer 220, which is much lower than a metallic/oxide contact resistance. This will result in a decrease in RA. The Mg protection layer 240 also protects the ferromagnetic reference layer 220 from unwanted oxygen penetration which will deteriorate TMR sensor properties.

The first oxygen treatment allows the Mg protection layer 240 to interact with oxygen for forming a part of the subsequently DC sputtered MgO lower barrier layer 230a. The oxygen gas pressure for this oxygen treatment preferably ranges from about $10^{-7}$ to $10^{-1}$ torr, and the oxygen flow time preferably ranges from about 1 to 10 minutes. This relatively mild oxygen treatment of the Mg protection layer 240 prevents the oxygen gas from penetration into the ferromagnetic reference layer 220.

The DC magnetron sputter deposition of the lower MgO barrier layer 230a from the same Mg target in the mixture of argon and oxygen gases results in oxygen doping directly into the growing Mg crystallite, so that the lower MgO barrier layer 230a acts as a high-spin-polarization tunneling path desired for exhibiting a high $\Delta R/R$. Excessive oxygen atoms may even be doped into the previous crystallite of the Mg protection layer 240 during the deposition of the lower MgO barrier layer 230a. The oxygen doping of the lower MgO barrier layer 230a should be carefully optimized to eliminate the existence of any residual Mg atoms not only in the lower MgO barrier layer 230a but also in the Mg protection layer 240, thus attaining the strongest tunneling effects. If the oxygen doping is absent or mild, residual Mg atoms will remain, thus deteriorating the TMR effects. If the oxygen doping is too strong, excessive oxygen may penetrate into the ferromagnetic reference layer 220 or even into the entire flux-closure structure, thus deteriorating the antiparallel coupling. Also, target "poisoning", i.e., the formation of oxides on the target surface, might occur to such an extent that plasma cannot be ignited for continuing the deposition.

The MgO barrier layer 230a was deposited at various gas pressures and for various times to determine the optimal parameters to avoid poisoning of the Mg target. It was determined that the Mg target will be poisoned when the deposition is conducted for 36 seconds in a mixture of an argon gas of $3 \times 10^{-4}$ torr and oxygen gas of $6 \times 10^{-6}$ torr, and also when the deposition is conducted for a much shorter time of 10 seconds in a mixture of argon gas of $3 \times 10^{-4}$ torr and oxygen gas of $8 \times 10^{-6}$ torr. It was found that the optimal oxygen doping can be achieved when the deposition is conducted for a time between 4 and 40 seconds in a mixture of an argon gas of $3\times10^{-4}$ torr and an oxygen gas of between about $0.4\times10^{-5}$ torr and about $1\times10^{-5}$ torr. Also, to further ensure that there is no poisoning of the Mg target, the Mg target may be heavily cleaned to erase the sputtering history before the next barrier-layer deposition.

Following the DC sputter deposition of the first or lower MgO barrier layer 230a, the optional second oxygen treatment (block 320) is conducted to facilitate the oxygen doping to eliminate the existence of residual Mg atoms without the Mg target poisoning. During this second oxygen treatment, the oxygen gas pressure preferably ranges from about $10^{-7}$ to $10^{-1}$ torr, and the oxygen flow time preferably ranges from 1 to 10 minutes. This oxygen treatment can be heavy, since the lower MgO barrier layer 230a is thick enough to prevent the oxygen gas from penetration into the ferromagnetic reference layer 220.

Next, the second or upper MgO barrier layer 230b is RF sputtered from the MgO target in the same module in the absence of the oxygen gas (block 325). The upper MgO barrier layer 230b, which is formed directly by Mg and oxygen atoms sputtered from the MgO target, also acts as a high-spin-polarization tunneling path desired for exhibiting a high $\Delta R/R$. Since this RF sputter deposition is conducted in the absence of oxygen gas, it does not provide oxygen doping into the underlying Mg protection layer 240. The DC magnetron sputter deposition and two oxygen treatments are thus proposed to maximize the TMR effects through the optimal oxygen doping.

Figure 6:
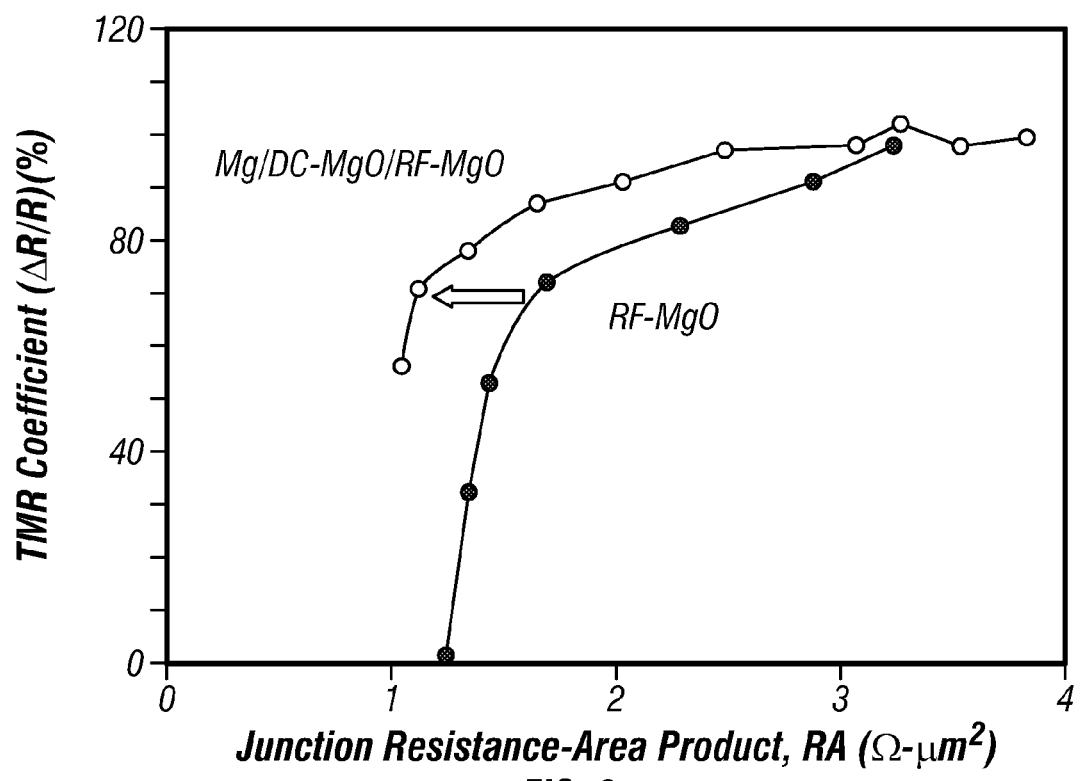
FIG. 6 shows a comparison of ΔR/R versus RA for TMR sensors with barrier layers comprising an RF sputtered MgO film and TMR sensors with barrier layers comprising DC/RF sputtered films fabricated according to the method of this invention.

The junction resistance-area product (RA) and the TMR coefficient ($\Delta R/R$) of the TMR sensors were measured with a current-in-plane probing technique. FIG. 6 shows $\Delta R/R$ versus RA for TMR sensors with RF-MgO barrier layers like those in the prior art and for TMR sensors with DC-MgO/RF-MgO barrier layers fabricated according to the method of this invention. The TMR sensors with the DC-MgO/RF MgO barrier layers fabricated according to this invention exhibit lower RA while maintaining higher $\Delta R/R$. For example, $\Delta R/R$ still remains as high as 56.6% at RA of 1.0 $\Omega\text{-}\mu m^2$. Based on this experimental evidence, it is believed that after the Mg protection layer 240 becomes part of the lower MgO barrier layer 230a through, the metallic/metallic contact at the interface between the ferromagnetic reference layer 220 and the Mg protection layer 240 might still remain, thus providing a lower contact resistance and a lower RA.

It has been found that if the barrier layer is ex-situ formed in more than one module, contamination caused by the wafer transportation from one module to the next module in lower vacuum leads to unwanted higher RA and lower $\Delta R/R$. It is thus important to ensure that the three deposition steps (blocks 305, 315 and 325) and the two oxygen treatments (blocks 310, 320) are conducted continuously in the same module in order to produce an in-situ barrier layer containing very few impurities and exhibiting a very low RA and a very high $\Delta R/R$.

While each of the first and second MgO barrier layers 230a, 230b is described as being made of an MgO film, it is understood that due to different MgO growth mechanisms, there may be different distributions of a minute number of vacancies, pinholes and trace impurities in the crystalline structure. Nevertheless, such a film can still be described as being a film consisting essentially of only MgO. Similarly, it is appropriate to refer to the MgO target as a target consisting essentially of only MgO or as a target consisting essentially of only Mg and oxygen.

In a modification of the method of this invention, an optional second Mg protection layer 250 (FIG. 4) and a third optional oxygen treatment ($3^{rd}$ OT) (FIG. 4) may be conducted after the RF sputter deposition of the second or upper MgO barrier layer 230b. This is shown in the process flow chart of FIG. 5 as steps 330, 335, respectively. A 0.2 nm thick Mg film 250 is DC sputtered in an argon gas of $3\times10^{-4}$ torr from an Mg target with a target power of 40 W. A third oxygen treatment ($3^{rd}$ OT) is conducted in the same module in an oxygen gas of $5\times10^{-7}$ torr, resulting in oxygen doping into the second Mg protection layer 250. During this third oxygen treatment, the oxygen gas pressure preferably ranges from about $10^{-7}$ to $10^{-1}$ torr, and the oxygen flow time preferably ranges from 1 to 10 minutes. This oxygen treatment can be very heavy, since the entire MgO barrier layer 230 is thick enough to prevent the oxygen gas from penetration into the ferromagnetic reference layer 220. With this modification, the contact resistance is further reduced, and thus the RA is further reduced.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A method of forming a barrier layer of a tunneling magnetoresistive (TMR) device, the barrier layer being located between ferromagnetic layers of the TMR device, the method comprising:
   (a) in a module of a sputtering system, conducting a DC magnetron sputter deposition over one of the ferromagnetic layers in the presence of oxygen from a first target consisting essentially of only magnesium (Mg); and
   (b) thereafter in said module, conducting an RF sputter deposition from a second target consisting essentially of only Mg and oxygen.

2. The method of claim 1 wherein the RF sputter deposition is conducted substantially immediately after the DC magnetron sputter deposition.

3. The method of claim 1 further comprising:
   between (a) and (b), introducing oxygen into said module.

4. The method of claim 1 further comprising:
   in said module, prior to (a), conducting a DC magnetron sputter deposition of a first film consisting essentially of only Mg from said first target; and
   substantially immediately thereafter in said module, introducing oxygen into said module to oxygen-dope said first Mg film.

5. The method of claim 1 further comprising:
   in said module, after (b), conducting a DC magnetron sputter deposition of a second film consisting essentially of only Mg from said first target; and
   substantially immediately thereafter in said module, introducing oxygen into said module to oxygen-dope said second Mg film.

6. The method of claim 1 wherein the DC magnetron sputter deposition in the presence of oxygen comprises introducing oxygen at a pressure from about $0.4\times10^{-5}$ torr to about $1\times10^{-5}$ torr into said module.

7. The method of claim 1 wherein the TMR device is a magnetoresistive read head.

8. The method of claim 1 wherein the TMR device is a magnetic memory cell.

9. A method of forming a barrier layer of a tunneling magnetoresistive (TMR) device, the barrier layer being located between first and second ferromagnetic layers of the TMR device, the method comprising:

(a) in a module of a sputtering system, forming over the first ferromagnetic layer a first magnesium-oxide (MgO) film consisting essentially of only MgO by a DC magnetron sputter deposition from a first target consisting essentially of only magnesium (Mg) and in an environment containing oxygen; and (b) in said module, forming over the first MgO film a second MgO film consisting essentially of only MgO by an RF sputter deposition from a second target consisting essentially of only MgO and in an environment substantially free of oxygen.

10. The method of claim 9 wherein forming the second MgO film comprises RF sputter deposition of the second MgO film directly on the first MgO film substantially immediately after forming the first MgO film by DC magnetron sputter deposition.

11. The method of claim 9 further comprising:
after forming the first MgO film by DC magnetron sputter deposition and before forming the second MgO film by RF sputter deposition, introducing oxygen into said module.

12. The method of claim 9 further comprising:
in said module, before forming the first MgO film by DC magnetron sputter deposition, forming a first Mg film consisting essentially of only Mg by DC magnetron sputtering from said first target; and
substantially immediately thereafter in said module, introducing oxygen into said module to oxygen-dope said first Mg film; and wherein forming the first MgO film comprises forming said first MgO film directly on said oxygen-doped first Mg film.

13. The method of claim 12 further comprising:
in said module, after forming the second MgO film by RF sputter deposition, conducting a DC magnetron sputter deposition of a second Mg film consisting essentially of only Mg from a target consisting essentially of only Mg; and
substantially immediately thereafter in said module, introducing oxygen into said module to oxygen-dope said second Mg film.

14. The method of claim 9 wherein forming the first MgO film by DC magnetron sputtering comprises introducing oxygen at a pressure from about $0.4 \times 10^{-5}$ torr to about $1 \times 10^{-5}$ torr into said module.

15. The method of claim 9 wherein the TMR device is a magnetoresistive read head.

16. The method of claim 9 wherein the TMR device is a magnetic memory cell.

* * * * *